(12) United States Patent
Hall et al.

(10) Patent No.: US 9,661,787 B2
(45) Date of Patent: May 23, 2017

(54) FACILITATING FRONT ACCESS TO REAR-MOUNTED ASSEMBLY IN EQUIPMENT CHASSIS

(71) Applicant: TELEFONAKTIEBOLAGET LM ERICSSON (PUBL), Stockholm (SE)

(72) Inventors: Bjoern Martin Gottfrid Hall, Santa Cruz, CA (US); Lucian Rusu, Nepean (CA); Lennart Schön, Sundbyberg (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 14/972,569

(22) Filed: Dec. 17, 2015

(65) Prior Publication Data

US 2016/0381836 A1    Dec. 29, 2016

Related U.S. Application Data

(60) Provisional application No. 62/186,222, filed on Jun. 29, 2015.

(51) Int. Cl.
| H05K 7/20 | (2006.01) |
| F04D 19/00 | (2006.01) |
| F04D 25/16 | (2006.01) |
| F04D 29/52 | (2006.01) |
| F04D 29/64 | (2006.01) |

(52) U.S. Cl.
CPC ....... *H05K 7/20718* (2013.01); *F04D 19/002* (2013.01); *F04D 25/166* (2013.01); *F04D 29/522* (2013.01); *F04D 29/644* (2013.01)

(58) Field of Classification Search
CPC .................................. H05K 7/20718
USPC ............... 361/679.48, 695, 685, 796–802
See application file for complete search history.

(56) References Cited

U.S. PATENT DOCUMENTS

| 6,115,250 A * | 9/2000 | Schmitt ..................... G06F 1/20 |
| | | 165/104.34 |
| 2013/0033159 A1* | 2/2013 | Immel ....................... E05D 3/02 |
| | | 312/236 |
| 2014/0118937 A1* | 5/2014 | Adrian ............... H05K 7/20172 |
| | | 361/695 |

* cited by examiner

*Primary Examiner* — Tuan T Dinh
*Assistant Examiner* — Mukund G Patel

(57) ABSTRACT

An equipment chassis includes a rear-mountable fan tray assembly (FTA) having a plurality of fans arranged into two or more FTA housing portions, the rear-mountable fan tray assembly being slidably insertable into and retractable from the equipment chassis for facilitating front-to-back airflow while providing ease of access. The FTA housing portions are articulatably coupled to each other and are arranged to follow a smooth motion path when traveling from a horizontal position to a vertical position and vice versa when the rear-mountable fan tray assembly is either inserted into or retracted from the equipment chassis, wherein a top FTA housing portion is guided by a top curvilinear tracking path and a bottom FTA housing portion is guided by a bottom curvilinear tracking path.

12 Claims, 7 Drawing Sheets

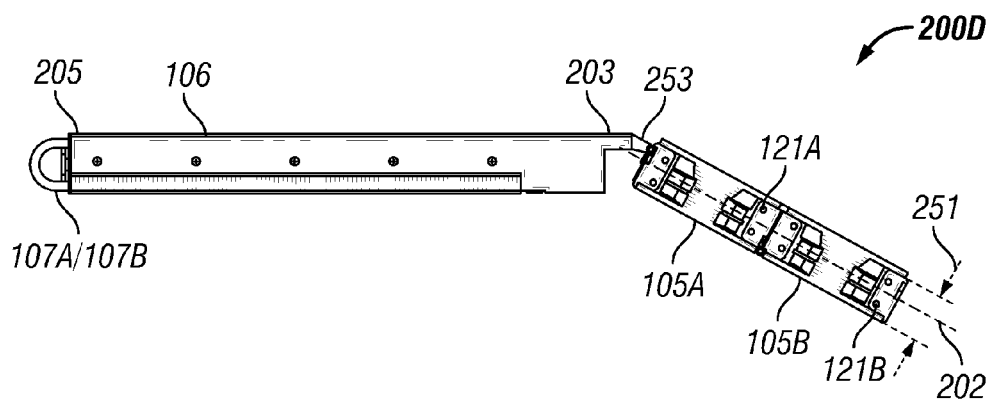
FIG. 2D
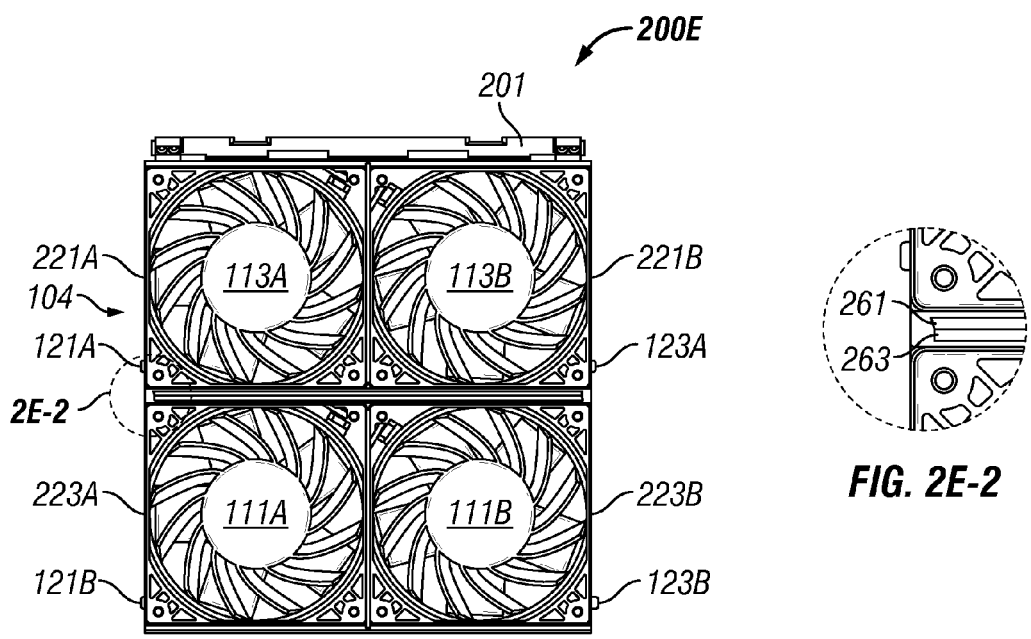
FIG. 2E-1
FIG. 2E-2

FACILITATING FRONT ACCESS TO REAR-MOUNTED ASSEMBLY IN EQUIPMENT CHASSIS

PRIORITY UNDER 35 U.S.C. §119(e) & 37 C.F.R. §1.78

This nonprovisional application claims priority based upon the following prior United States provisional patent application(s): (i) "METHOD AND APPARATUS FOR FACILITATING FRONT FAN ACCESS," Application No.: 62/186,222, filed Jun. 29, 2015, in the name(s) of Bjoern Hall and Lucian Rusu; each of which is hereby incorporated by reference in its entirety.

FIELD OF THE DISCLOSURE

The present disclosure generally relates to mechanical form factor optimization in equipment. More particularly, and not by way of any limitation, the present disclosure is directed to facilitating front access to rear-mounted assemblies such as fan units, power supplies, and the like in equipment deployed, for example, in network infrastructure.

BACKGROUND

Front to back airflow is a NEBS (Network Equipment Building Systems) requirement for equipment installed in a central office. Straight (rather than curved) airflow gives optimum thermal performance. Consequently, the most optimum cooling solution is to have fans mounted to the rear of the equipment, e.g., router chassis. Although techniques such as rail-guided fan tray assemblies are sometimes used to improve airflow in equipment, various shortcomings and deficiencies continue to persist.

SUMMARY

The present patent disclosure is broadly directed to facilitating frontal access to rear-mounted assemblies such as fan units, power supplies, etc. in an equipment chassis. An equipment chassis includes, in one example embodiment, a rear-mountable fan tray assembly (FTA) having a plurality of fans arranged into two or more FTA housing portions or frames, the rear-mountable fan tray assembly being slidably insertable into and retractable from the equipment chassis for facilitating front-to-back airflow while providing ease of access. The FTA housing portions are articulatably coupled to each other and are arranged to follow a smooth motion path when traveling from a horizontal position to a vertical position and vice versa when the rear-mountable fan tray assembly is either inserted into or retracted from the equipment chassis, wherein a top FTA housing portion is guided by a top curvilinear tracking path and a bottom FTA housing portion is guided by a bottom curvilinear tracking path. In one example implementation, an embodiment of the present invention may be provided as part of a NEBS-compliant equipment unit.

Without limitation, example embodiments and advantages of the present invention are set forth in the context of the following. In some installation cases, such as in smaller central offices or indoor/outside plant installations, there is no rear access to the installed unit (e.g., because the unit is pushed up against a wall and/or the unit is rigidly anchored to a floor or other foundation structures). This makes it nearly impossible to replace a fan mounted to the rear of the chassis. Providing front access to rear mounted fan units in accordance with the teachings herein allows optimum thermal/cooling performance while still making it possible to replace a failed fan without taking the system out of service. An embodiment of the present invention also overcomes the shortcomings of current technologies such as adding excessive height and depth to the product. It should be noted that some of the current technologies may involve side-by-side airflow, use of curved airflow, or provision of intake on lower front, vertical flow inside the system, and exhaust on upper rear of the equipment, all of which have various deficiencies. For example, side-by-side airflow installations are subject to ambient temperature penalties imposed by standards-setting bodies such as Telcordia. In curved airflow installations, the air is taken in on part of the front panel (typically to one side), turned sideways across the internal modules, e.g., boards, and then ejected at a rear vent rear. Although other variants of curved airflow exist, they are all known to be less efficient due to high pressure rise, air flow vortex formation (i.e., lack or loss of laminar flow), and formation of zones with no airflow. Where the intake on lower front is provided, with vertical flow inside the system, it is generally wasteful of vertical space for plenums and requires a large number of vertical cards to fill the width (in the order of 10 cards side by side depending on card pitch), which makes this approach problematic for small systems.

Further, in data center equipment, e.g. top-of-rack or TOR switches, straight front to back airflow is common. In that environment rear access is usually available and there is no requirement for an air filter. Such an arrangement typically allows using all available space on the front panel for air inlets, while all available space on the rear can be used for fans. Increased thermal power dissipation in modern network equipment such as, e.g., routers, bridges, switches, server racks, etc. due to putting ever-increasing higher performance requirements in a small form factor, leads to increased cooling performance requirements. For example, increasing optics module power dissipation for long reach, high bit rate optics, together with high optics port density requirements, makes the cooling problem very challenging. Meeting these requirements forces NEBS-compliant equipment to move to the more efficient straight front to back cooling previously used in data centers. An added complication in smaller central offices and metro aggregation points of presence is that rear access to the installed unit is frequently not available. If the fans cannot be accessible from the front in such an installation, any fan replacement requires taking the whole system out of service. Existing equipment that uses straight front to back airflow ignores this problem, whereas equipment that does have front fan access use one of the less efficient cooling techniques mentioned above.

One approach to providing frontal access to rear mounted fans is to mount them on some sort of rails on the rear to allow them to be extracted from the front. However, such solutions to mounting fans on rails on the rear have several problems. For instance, the rails add both height and depth to the unit in order to allow the fans to turn the corner and slide down to the rear of the box. Trying to prevent this issue typically results in the fans being canted, which makes the cooling capacity inferior, interferes with other equipment mounted above or below the unit, and makes the air seal problem more difficult, although a tight air seal is needed when the fans are installed in order to prevent recirculation in the equipment housing. Further, inserting and retracting the fans can be difficult due to the high insertion and retraction forces necessary.

As will be seen below, embodiments of the present invention advantageously overcome these issues. Additional benefits and advantages of the embodiments will be apparent in view of the following description and accompanying Figures.

BRIEF DESCRIPTION OF THE DRAWINGS

Embodiments of the present disclosure are illustrated by way of example, and not by way of limitation, in the Figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing Figures in which:

FIG. 2D is a CAD rendering or a side view based thereon of the rear-mountable FTA and cantilever pusher according to one example embodiment of the present invention;

FIG. 2E, comprising FIGS. 2E-1 and 2E-2, is a CAD rendering or a side plane or top plane view based thereon of the rear-mountable FTA unit with its individual FTA housing portions snapped shut.

DETAILED DESCRIPTION OF THE DRAWINGS

In the following description, numerous specific details are set forth with respect to one or more embodiments of the present patent disclosure. However, it should be understood that one or more embodiments may be practiced without such specific details. In other instances, well-known modules, subsystems, components, structures and techniques have not been shown in detail in order not to obscure the understanding of the example embodiments. Accordingly, it will be appreciated by one skilled in the art that one or more embodiments of the present disclosure may be practiced without such specific components-based details. It should be further recognized that those of ordinary skill in the art, with the aid of the Detailed Description set forth herein and taking reference to the accompanying drawings, will be able to make and use one or more embodiments without undue experimentation and will further appreciate that the inventors hereof had possession of the embodiments set forth herein.

Additionally, terms such as "coupled" and "connected," along with their derivatives, may be used in the following description, claims, or both. It should be understood that these terms are not necessarily intended as synonyms for each other. "Coupled" may be used to indicate that two or more elements, which may or may not be in direct physical or mechanical contact with each other, co-operate or interact with each other. "Connected" may be used to indicate a mechanical communicative relationship, between two or more elements that are coupled with each other.

Figure 1A:
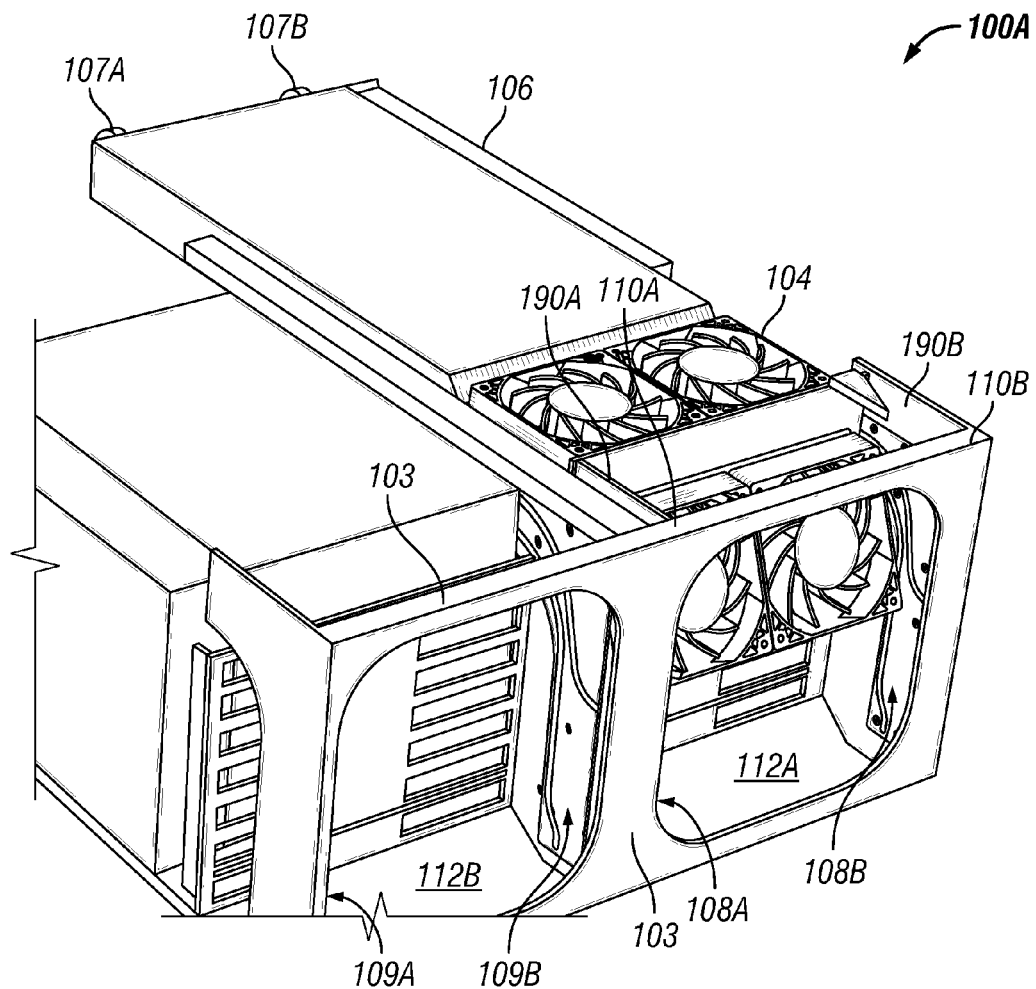
FIG. 1A depicts a 3-dimensional (3D) cutaway view of an example equipment or rack chassis, rendered as a computer-aided drawing (CAD) or a view based thereon, including a rear-mountable fan tray assembly (FTA) that is slidably insertable for facilitating front access according to one embodiment of the present invention.

One or more embodiments of the present patent disclosure are exemplified by taking reference to various drawing Figures described hereinbelow, wherein the depicted features, components, structures, etc., are not necessarily drawn to scale and similar elements are shown with the same reference numerals throughout the different views where feasible. FIG. 1A depicts a 3-dimensional (3D) computer-aided drawing (CAD) cutaway view or a rendering based thereon 100A of an example equipment or rack chassis 102 including a rear-mountable fan tray assembly 104 that is slidably insertable for facilitating front access to the fan assembly 104 according to one embodiment of the present invention. It should be realized that the example equipment rack or chassis 102 may be provided as part of any type of equipment having a housing that encloses any type of electrical and/or mechanical components, wherein a plurality of fans configured into two or more horizontal rows may be provided for facilitating front-to-back airflow in the equipment. Further, in certain implementations, the fan tray assembly 104 may be provided in association with one or more power supply units. Accordingly, the terms "fan tray assembly" (FTA), "fan assembly unit" (FAU), "power supply unit" (PSU), or "power and fan tray unit" (PFTU), or terms of similar import may be somewhat interchangeably used in one or more embodiments of the present invention. Whereas the embodiments herein are described in reference to network equipment (e.g., routers, switches, bridges, server farms, data warehousing equipment, or other telecommunications equipment or gear) that may be provided as stackable racks or other configurations, which may be rigidly fixed to a building structure (e.g., floors, walls, frames, and the like), it should be appreciated that the teachings of the present patent application are not limited thereto and one or more aspects of the invention may be practiced in various other types of equipment requiring airflow or ventilation facilitated by rear-mounted fans of fan assemblies.

Figure 1B:
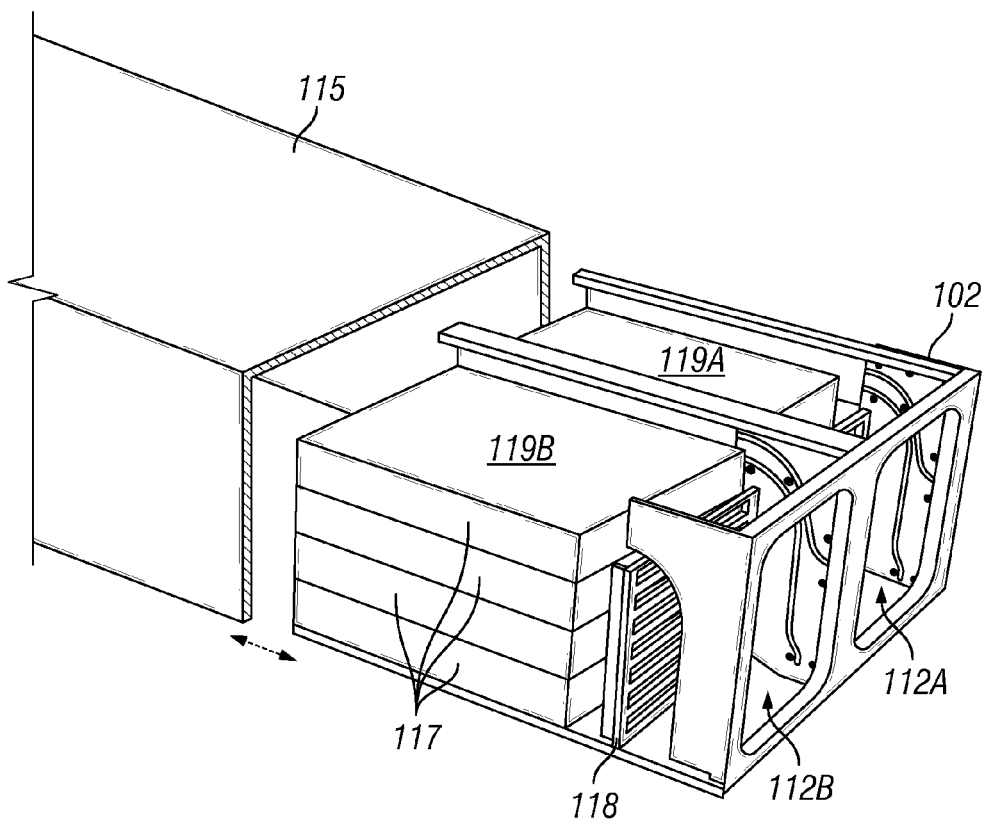
FIG. 1B depicts another 3D cutaway view, rendered as a CAD figure or a view based thereon, of the example equipment or rack chassis with a housing enclosure removed (e.g., of a network element) and the rear-mountable FTA unit fully retracted out to highlight an embodiment of dual slide guide plate features provided for facilitating smooth tracking of the rear-mountable FTA unit during insertion or extraction from the equipment chassis.
Figure 1C:
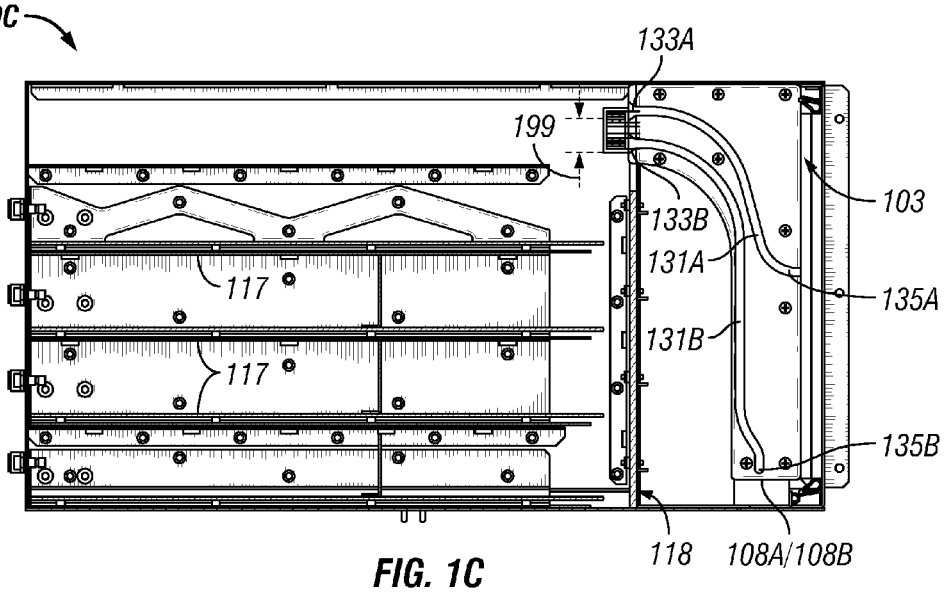
FIG. 1C is a CAD rendering or a cross-sectional side view based thereon of the equipment chassis showing dual slide tracking features, e.g., channels or rails, having curvilinear geometries optimized for smooth tracking of the rear-mountable FTA unit according to an example embodiment of the present invention.
Figure 2A:
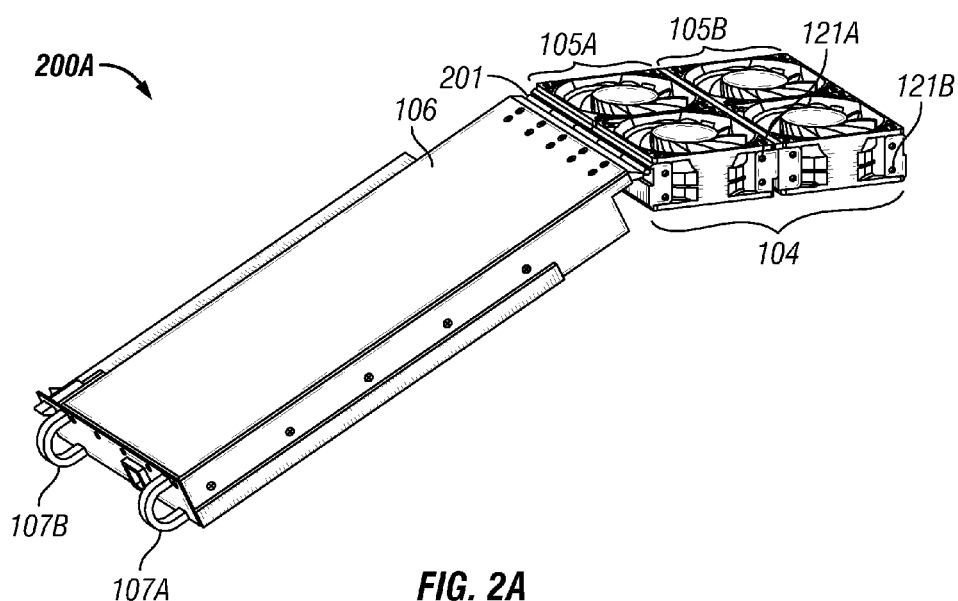
FIG. 2A depicts a CAD rendering or a 3D perspective view based thereon of the rear-mountable FTA unit coupled to a cantilever pusher member having an insertion force applicator for facilitating insertion and retraction of the FTA unit according to one example embodiment of the present invention.
Figure 2B:
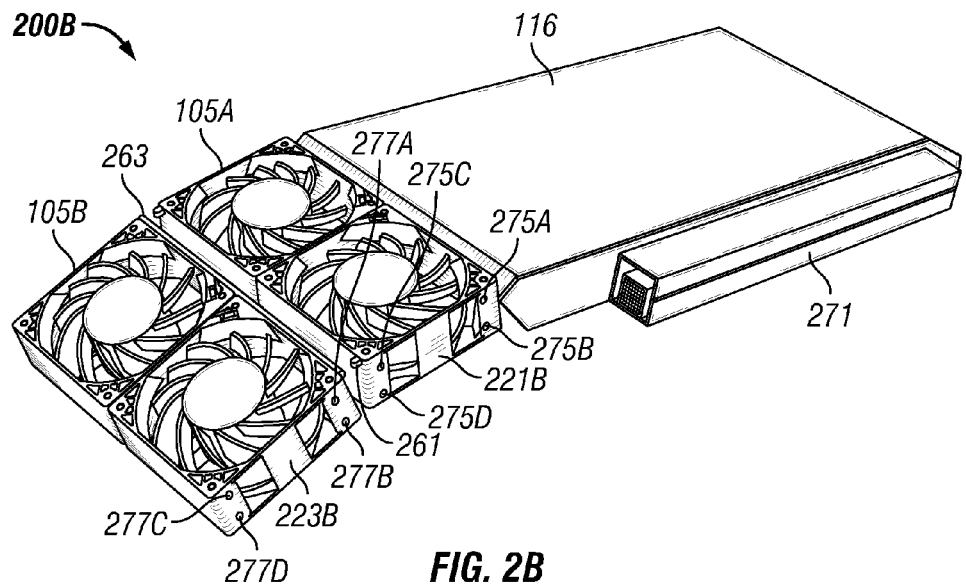
FIGS. 2B and 2C depict additional 3D perspective views, rendered as CAD figures or views based thereon, of the rear-mountable FTA and cantilever pusher showing further features provided in accordance with an example embodiment of the present invention.
Figure 2C:
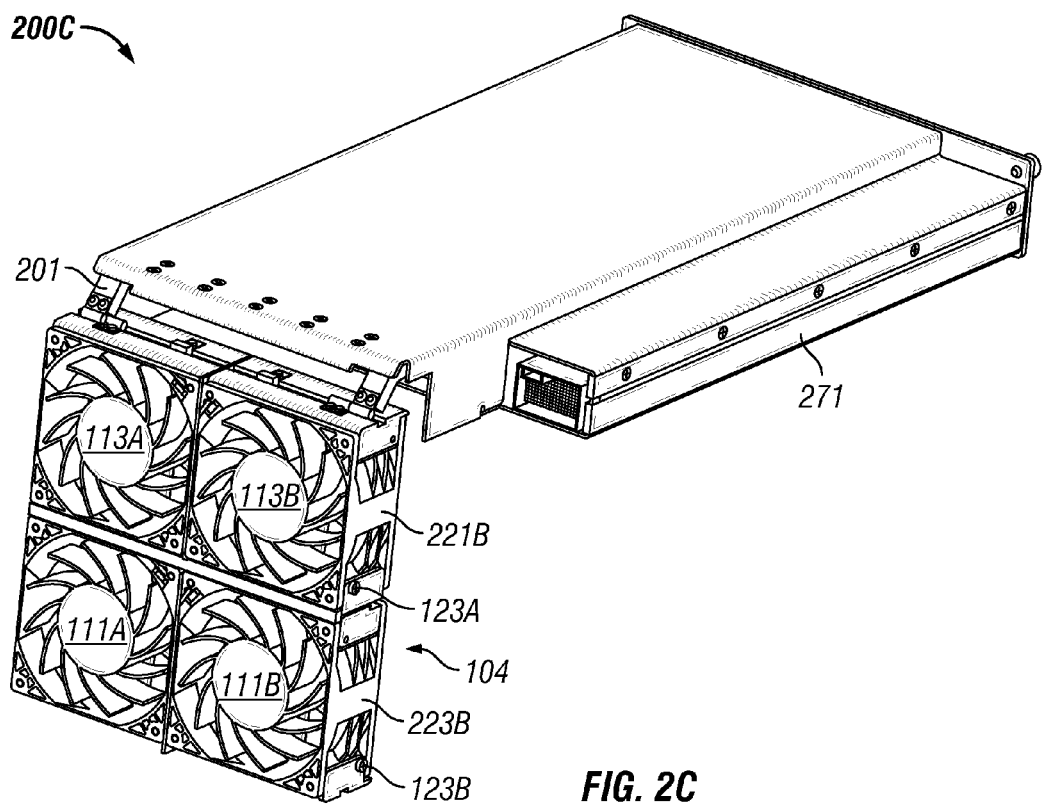
Figure 2F:
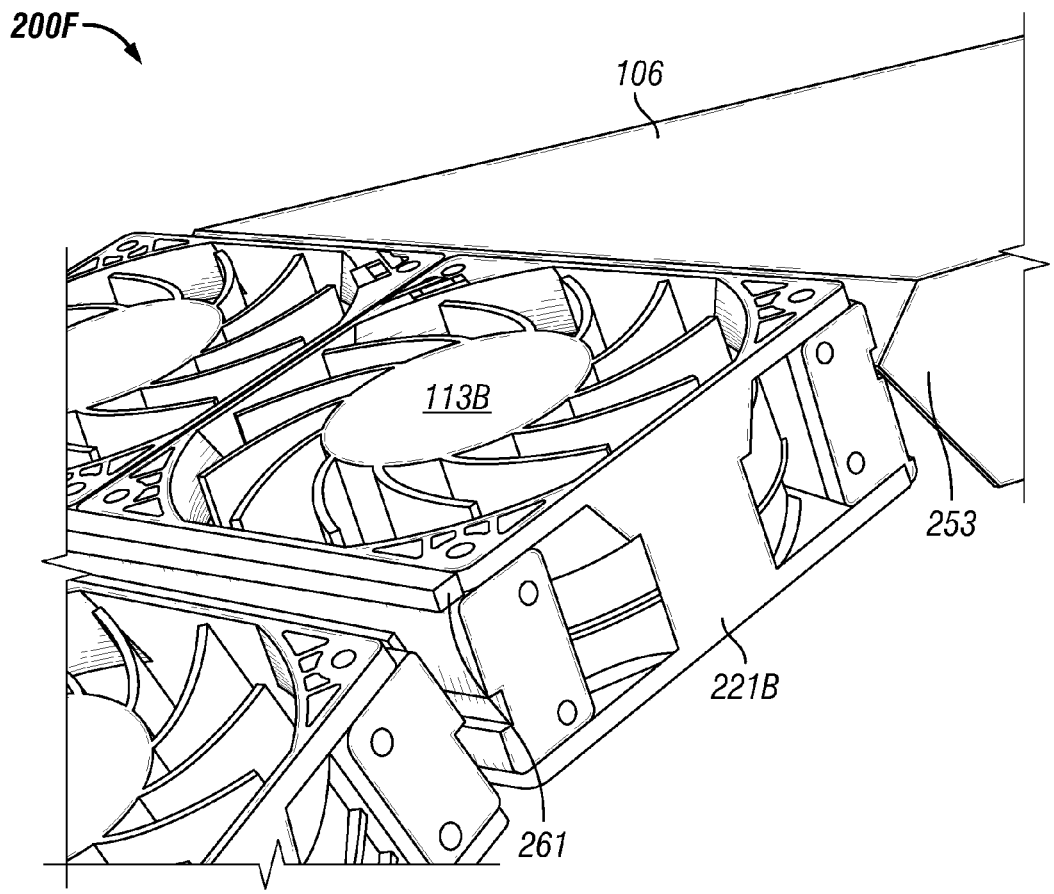
FIGS. 2F and 2G show additional 3D cutaway CAD renderings or 3D perspective views based there on of a standalone rear-mountable FTA/pusher unit and of a rear-mountable FTA/pusher unit partially inserted in the equipment chassis showing additional features according to an example embodiment of the present invention.
Figure 2G:
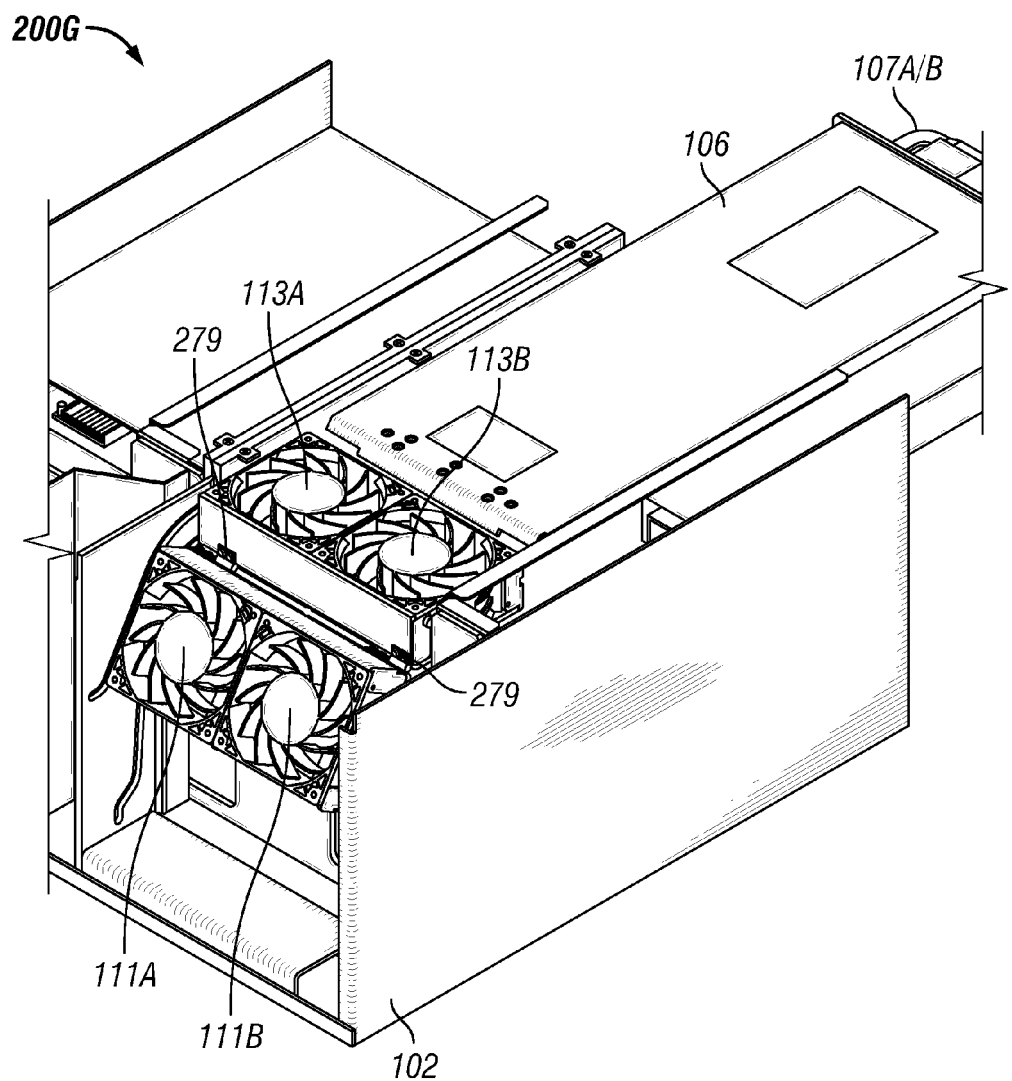

FIG. 1B depicts another 3D cutaway view 100B of the example equipment or rack chassis 102 with a housing enclosure 115 removed (e.g., in a network element) and the rear-mountable FTA unit fully retracted out to highlight interior compartmental spaces as well as an embodiment of dual slide guide plate members 108A/B provided for facilitating smooth tracking of the rear-mountable FTA unit during insertion or extraction from the equipment chassis 102. FIG. 1C is a CAD rendering of a side view 100C of the equipment chassis 102 showing dual slide tracking features 131A/131B, e.g., channels or rails, having curvilinear geometries optimized for smooth tracking of the rear-mountable FTA unit 104 according to an example embodiment of the present invention. FIG. 2A depicts a CAD rendering of a 3D perspective view 200A of the rear-mountable FTA unit 104 coupled to a cantilever pusher member 106 having an insertion force applicator for facilitating insertion and retraction of the FTA unit 104 in one example embodiment. FIGS. 2B and 2C depict additional 3D perspective views 200B, 200C of the rear-mountable FTA unit 104 and cantilever pusher 106 showing further features provided in accordance with an example embodiment. FIG. 2D is a CAD rendering of a side view 200D of the rear-mountable FTA unit 104 and cantilever pusher 106 according to one example embodiment. FIG. 2E-1 is a CAD rendering of a side plane or top plane view 200E of the rear-mountable FTA unit 104 with its individual FTA housing portions snapped shut using snapping device mechanisms 261/263 shown in enlarged detail view of FIG. 2E-2, and described in additional detail hereinbelow. FIGS. 2F and 2G show additional 3D cutaway CAD renderings or 3D perspective views based there on of a standalone rear-mountable FTA/pusher unit and of a rear-mountable FTA/pusher unit partially inserted in the equipment chassis showing additional features according to an example embodiment of the present invention. One of ordinary skill in the art will recognize that in the foregoing drawing Figures as well as their description hereinbelow, CAD mechanical drawing renderings of the Figures or views rendered based thereon are equivalent, as a skilled artisan will be able to generate suitable renderings based on CAD output. Accordingly, the adjectival use of the term "CAD" or any term of similar import with respect to any drawing Figures herein is non-limiting and any number of different types of equivalent views or drawing Figures may be constructed from such CAD renderings for purposes of the present patent application upon reference hereto.

By taking reference to the foregoing Figures cumulatively, at least in some partial combination thereof, embodiments of the present invention will be set forth in an example implementation comprising a number of innovative features with respect to an equipment chassis or a network element that in one illustrative configuration can be NEBS-compliant in terms of providing front-to-rear airflow while facilitating access to rear-mounted fans. Broadly, an equipment rack or chassis of the present invention comprises, inter alia, a rear-mountable FTA having a plurality of fans configured into two or more horizontal rows, with each row comprising one or more fans disposed in an FTA housing portion, wherein each FTA housing portion is coupled to an adjacent FTA housing portion in an articulated manner. For example, an FTA unit such as unit 104 may comprise four fans in a 2×2 configuration, with two fans (e.g., fans 113A/113B shown in FIG. 2E) disposed in a housing or retaining structure forming a top FTA housing portion 105A and two fans (e.g., fans 111A/111B shown in FIG. 2E) disposed in a housing or retaining structure forming a bottom FTA housing portion 105B, which [2×2] configuration may be suitably dimensioned to cover a vent or aperture 112A of a corresponding size provided as part of a rear wall 103 of the chassis 102. In general, where an [M×N] configuration of a total of M times N fans is used in an FTA unit, M rows (each having N fans) may be housed in a housing or frame structure (e.g., formed from substantially rigid materials such as plastics, metals, and the like) as an FTA housing portion retained by outer vertical walls and a top and bottom horizontal wall, the orientations being relative to the vertical and horizontal axes of the equipment rack chassis. Of the M FTA housing portions, a first FTA housing portion may be referred to as top FTA housing portion (e.g., FTA housing portion 105A) and a last FTA housing portion may be referred to as bottom housing portion (e.g., FTA housing portion 105B), with [M-2] intermediary FTA housing portions being articulatedly disposed therebetween. One skilled in the art will realize that the nomenclature of top and bottom FTA housing portions is taken in reference to whether the example FTA unit 104 is slidably inserted into the equipment chassis using a mechanism such as wheels, rails, grooves, channels, tracks, sliding surfaces, and the like, provided at the top of the chassis (which may be referred to as top-feeding FTA implementation) or at the bottom of the chassis (which may be referred to as bottom-feeding FTA implementation). In accordance with the teachings of the present invention, a cantilevered pusher member 106 having a frontend 205 and a backend 203, wherein one or more handles, loops, knobs, etc. e.g., reference numerals 107A/107B in FIG. 2B, are provided at the frontend 205 and an insertion force applicator 253 is provided at the backend 203 that is articulatedly coupled to the first FTA housing portion 105A, whereby the entire assembly may be provided as a single unit, module or subsystem, e.g., as an FTA and pusher unit 106/104, for facilitating insertion/retraction of the FTA unit 104 as will be described in additional detail below. Although the example embodiments herein will be set forth in particular reference to a top-feeding FTA implementation with a single FTA/pusher arrangement (e.g., FTA and pusher unit 106/104, a skilled artisan will further recognize that the teachings of the present invention is not limited thereto, which can be also applied to a bottom-feeding FTA implementation, mutatis mutandis, with either implementations having two or more FTA/pusher units that may be separately insertable and retractable, wherein each FTA/pusher unit is operative for controlling airflow in a section, subsection, compartment or sub-compartment of the interior space enclosed by the chassis. In a still further arrangement, both top-feeding and bottom-feeding FTA implementations may be provided in an equipment chassis, wherein the top and bottom FTA/pusher units may be alternately disposed in the chassis, each FTA/pusher unit controlling airflow in a respective compartment thereof. In an example arrangement illustrated in FIG. 1B, wherein the housing enclosure 115 has been removed, two such compartments 119A and 119B are illustrative, each containing electronic devices, modules, line cards, power supply units, processor/memory modules, boards, additional power supplies, etc., collectively shown at reference numeral 117, which may be coupled to a backplane 118 disposed near the rear wall 102.

In one example arrangement, each FTA housing portion 105A, 105B may be coupled to its adjacent FTA housing portion(s) (e.g., FTA portion 105B adjacent to FTA housing portion 105A, and vice versa) using a hinge or similar mechanism that allows sufficient articulation so as to enable a smooth tracking motion for negotiating a curvilinear path as the FTA unit 104 travels from a horizontal position to a vertical position when is pushed for insertion into the equipment or from a vertical position to a horizontal position when pulled for retraction from the equipment. By way of illustration, a close-up view of example hinges 279 between FTA portions 105A and 105B are shown in a partial 3D cutaway CAD rendering or 3D perspective view 200G based thereon of the partially inserted rear-mountable FTA/pusher unit illustrated in FIG. 2G. By way of further illustration, such a hinge mechanism may be implemented using one or more of barrel hinges, pivot hinges, case hinges, continuous or partial plano hinges, butterfly hinges, flag hinges, strap hinges, counterflap hinges, flush hinges, coach hinges, butt hinges, spring hinges and tee hinges, etc., depending on structural and functional requirements and other form factor considerations. Similarly, the backend (also somewhat interchangeably referred to as the distal end) 203 of the cantilevered pusher member 106 may be articulatedly coupled to the top FTA housing portion 105A of an FTA unit 104 using a hinge mechanism 201 (shown in FIG. 2C, which may be selected from one or more of barrel hinges, pivot hinges, case hinges, continuous or partial plano hinges, butterfly hinges, flag hinges, strap hinges, counterflap hinges, flush hinges, coach hinges, butt hinges, spring hinges and tee hinges, etc.

In one example arrangement, the top FTA housing portion 105A is provided with a pair of top guiding pins, posts, etc., e.g., reference numerals 121A/123A shown in FIG. 2E, on respective outer vertical walls 221A/221B of the top FTA housing portion or frame 105A, i.e., one pin/post on each of the two outer vertical walls of the FTA frame 105A. Likewise, the bottom FTA housing portion 105B is provided with a pair of bottom guiding pins or posts 121B/123B on its respective vertical walls 223A/223B of the housing frame 105B. In one implementation, each FTA housing portion's frame may be provided a plurality of holes at specific locations that can accept the guiding pins or posts, whereby the FTA frames can be mass-produced and/or interchangeably utilized in an equipment unit by inserting the guiding pins in the right hole for the right application (e.g., a top-feeding FTA application vs. a bottom-feeding FTA application, etc.). By way of example, reference numerals 275A-D refer to four holes provided on the outer vertical wall 221B of the first FTA housing frame 105A, as shown in FIG. 2B. Likewise, another set of four holes are symmetrically placed on the other outer vertical wall 221A, although not visible in the 3D perspective view 200B of FIG. 2B. In similar fashion, reference numerals 277A-D refer to four visible holes provided on the outer vertical wall 223B of the last or bottom FTA housing portion 105B. The positioning of guiding pins 121A/123A on the first/top FTA housing portion 105A and guiding pins 121B/123B on the last/bottom FTA housing portion 105B is configured such that the pins are operative to track corresponding tracking paths provided on a pair of slide guide plates (for each FTA/pusher module) controlling the movement of an FTA/pusher unit of the chassis. As set forth in the side view 100C shown in FIG. 1C, the tracking paths are provided as a pair, a first/top curvilinear path 131A and a second/bottom curvilinear path 131B, having specifically engineered curvilinear layouts (e.g., substantially "S" shaped or contiguous arcuate geometries) in order to ensure smooth negotiating of the substantially right-angled chassis corners by the FTA unit 104 as it travels from the horizontal position to the vertical position (e.g., when pushed for insertion into the equipment or a compartment thereof) or vice versa (e.g., when pulled for retraction from the equipment or a compartment thereof).

In one example arrangement, the tracking paths 131A/131B provided with each slide guide plate, e.g., slide guide plate 108A/108B for compartment 119A or slide guide plate 109A/109B for compartment 119B (as shown in FIGS. 1A and/or 1B), may be constructed as a pair of channels, rails, tracks, ridges, and the like. Where implemented as a "channel", the tracking path 131A/131B may comprise an indentation that is suitably dimensioned to accept or accommodate a corresponding guiding pin (e.g., top guiding pins 121A/123A or bottom guiding pins 121 B/123B) on the FTA housing frame 105A/105B, the channel being curvilinearly formed to follow a specific path designed to ensure a smooth retraction/insertion motion as noted above. As a "rail" or "ridge" or "track", etc., the tracking path 131A/131B may be formed as a curvilinear raise or a ridge on which a corresponding guiding pin rests and travels along to follow a specific path similarly designed.

It should be appreciated that an example equipment chassis may comprise more than two or more compartments, as exemplified in FIG. 1B, each having airflow control provided by a corresponding FTA/pusher unit operating as set forth herein in association with the pair of slide guide plates (i.e., dual slide guide plate arrangement). As illustrated in the 3D cutaway perspective view 100A shown in FIG. 1A, reference numerals 108A (referring to one slide guide plate hidden from view) and 108B refer to the pair of slide guide plates operative for the FTA/pusher unit 104/106 with respect to the compartment 119A (shown in FIG. 1B). Likewise, reference numerals 109A (referring to one slide guide plate hidden from view) and 109B refer to the pair of slide guide plates operative for another FTA/pusher unit (not shown) with respect to the compartment 119B (shown in FIG. 1B). In one example implementation, a first slide guide plate (e.g., slide guide plate 108A) of the dual slide guide plate arrangement is vertically disposed relative to a first interior/exterior sidewall frame 190A of the equipment chassis 102 and coupled at a first vertical joint 110A of rear wall 103 of the equipment chassis 102, the rear wall 103 having an aperture 112A operating as a vent for the plurality of fans 113A/B and 111A/B of the FTA unit 104. A second slide guide plate (e.g., slide guide plate 108B) is vertically disposed relative to a second sidewall frame 190B (e.g., interior or exterior sidewall, depending on which compartment) of the equipment chassis 102 and coupled at a second vertical joint 110B of the rear wall 103 of the equipment chassis 102, the first and second sidewall frames 190A/190B being substantially parallel to each other and forming at least a compartment (e.g., compartment 119A) of the equipment chassis 102. A skilled artisan will recognize that the slide guide plates 108A/B and 109A/B may be machined, fabricated, constructed or formed using a variety of materials similar to the materials used in the construction of the equipment rack/chassis 102, although not necessary, and may be joined, riveted, bonded, attached, fixed, coupled, bolted, or otherwise integrally formed relative to the sidewall frame members and the rear of the chassis in conventional manner. With respect to a particular compartment of the chassis, the first and second slide guide plates, e.g., slide guide plates 108A/108B, are disposed substantially parallel to each other, having the respective dual slide tracking paths (e.g., the top and bottom curvilinear tracking paths 131A/131B) facing each other such that the top curvilinear paths define a top curvilinear plane and the bottom curvilinear tracking paths define a bottom curvilinear plane, which together define two smooth-curved planes that an FTA unit 104 traverses while in motion. In one example arrangement, the top curvilinear tracking features or paths 131A of the first and second slide guide plates 108A/108B operate to engage the respective top guiding pins 121A/123A of the top FTA housing portion 105A and the bottom curvilinear tracking features or paths 131B of the first and second slide guide plates 108A/108B operate to engage the respective bottom guiding pins 121B/123B of the bottom FTA housing portion 105B when the rear-mountable fan tray assembly 104 is slidably inserted into the equipment chassis 102 and pushed (along a tracking mechanism involving wheels, rails, grooves, etc. as noted previously), using the handles/knobs 107A/B of the cantilevered pusher member 106, from front to back of the equipment chassis 102 by applying substantially horizontal force toward the rear wall 103, whereby the articulated FTA housing portions 105A/105B negotiate a curvilinear motion path from a horizontal orientation to a vertical orientation with minimal friction. Further, FTA housing portions 105A/105B, upon full insertion, are configured to be disposed vertically with insubstantial angular deviation (e.g., less than 5 or 10 degrees) relative to the rear wall 103 of the equipment chassis (i.e., with little to no canting), thereby ensuring a substantially tight air seal.

As noted previously, the top guiding pins 121A/123A may be provided in one example implementation as replaceable pins/posts inserted in corresponding holes formed in the respective outer vertical walls of the top FTA housing portion 105A. Likewise, the bottom guiding pins 121B/123B may also be provided as replaceable pins/posts inserted in corresponding holes formed in the respective outer vertical walls of the bottom FTA housing portion 105B. However, it should be appreciated that it is not necessary to practice an embodiment of the present invention with such replaceable pins. Integrally formed pins, posts or other similar structures may be provided as part of the FTA housing frames in a more permanent application. Whether provided as replaceable pins or otherwise, the placement or positioning of top guiding pins 121A/123A and the bottom guiding pins 121B/123B is important in ensuring that the fan tray portions are entered into or engaged by the tracking paths 131A/131B on the dual slide guide plates (e.g., 108A/108B) with minimal friction and tracked in a smooth manner without catching or other mechanical interruptions. Preferably, top guiding pins 121A/123A are offset relative to bottom guiding pins 121B/123B, from a median plane or axis 202 of the rear-mountable FTA unit 104 as illustrated in FIG. 2D. Further, the offset 251 between the top guiding pins and the bottom guiding pins corresponds to a distance 199 between proximal termini 133A of the top curvilinear tracking paths 131A and proximal termini 133B of the bottom curvilinear paths 131B provided with each slide guide plate 108A/108B. Because the top curvilinear tracking path 131A and the bottom curvilinear path 131B provided with each slide guide plate 108A/108B start at the respective proximal termini 133A/133B and follow a corresponding substantially smooth S-shape or trajectory until respective distal termini 135A/135B, such an arrangement advantageously overcomes the shortcomings and deficiencies of the current technologies noted elsewhere in the present patent application.

In a still further arrangement, each FTA housing portion 105A/105B may be provided with a snap-on alignment locking device operative to removably snap onto or into a corresponding to a snap-on alignment locking device provided with an adjacent FTA housing portion when the rear-mountable FTA unit 104 is fully inserted into the equipment chassis or when the FTA housing portions are required to be aligned on a flat surface. In the illustrative views of FIGS. 2B and 2E, reference numeral 261 refers to a snap-on alignment structure provided at the bottom side of the top FTA housing frame 105A which corresponds to a counterpart snap-on alignment structure 263 provided as part of the top side of the bottom FTA housing frame 105B, which together are operative to lock the two housing frames shut when placed against the rear wall of the chassis (thereby reducing airflow leakage in a compartment). A close-up view of snap-on alignment structure 261 is also shown in a partial 3D cutaway CAD rendering or 3D perspective view 200F based thereon of the standalone rear-mountable FTA/pusher unit illustrated in FIG. 2F.

In a still further arrangement, any gaps formed between an FTA housing portion and a next FTA housing portion adjacent thereto to which it is articulatedly coupled may be filled with a flexible filling material to prevent introduction of any foreign objects that might jam up the FTA unit. Such filling material may comprise any type of soft expandable foam materials, lining materials, flexible rubber flaps, bellows, and the like.

In a still further arrangement where a plurality of component and/or assembly cards or boards (e.g., line cards, management cards, processor cards, memory/storage cards, as well as components such as power supply units etc.) stacked in a compartment of the equipment chassis (e.g., in a network element application shown in FIG. 1B), such component assemblies 117 (or "component cards", more generally) may be stacked and coupled to backplane 118 disposed in the equipment chassis 102, and a rigidly attached connector member or tube 271 (having circular, rectangular, or any other cross-sectional shape) containing various connectors, wires, etc. for carrying power, data, or other information signals may be provided as a conduit alongside the cantilever pusher member 106 as illustrated in FIG. 2B. Preferably, connector member 271 is dimensioned such that when the rear-mountable FTA unit 104 is fully inserted into the chassis 102, all the wires and connectors of the connector member 271 are aligned into proper electrical/mechanical connectivity with respect to suitable receptacles provided on the backplane 118. Relatedly, it should be understood that the cantilever pusher member 106 may also serve other functions in the chassis in addition to being just a "conduit" of force applied from the handles 107A/B to the applicator 253. For example, the pusher member 106 may be configured or arranged to provide a separate housing or compartment that can enclose additional assemblies, such as one or more power supply units, therein.

Based on the foregoing, an example chassis embodiment of the present invention may advantageously comprise one or more of the following features:

(i) Dual slide guide plate arrangement for the two fan rows in a [2×2] FAU wherein the top fan row slides on one channel, the bottom fan row on the other channel. The guidance into the slide channels may be achieved by using only two slide pins or posts per fan side. The guide plates can be simply machined (as per the mock-up build, for example) or hard-tooled later for the lowest cost.

(ii) Geometry of the dual slide guide plate rails or channels that allows the fans to slide in flat, tilt down to turn the corner over the top of a backplane provided in the chassis, and then articulate to a final completely vertical position on the rear of the chassis. The geometry is such that the tolerances are tight at the end positions to ensure connector mating and minimum vibration when installed, while the rails/channels are wider in intermediate positions to reduce friction and insertion force.

(iii) A flexible material filling the hinge gap when the fans are inserted. This prevents foreign objects from lodging in this gap and causing the whole FTA unit to get stuck in an intermediate position.

(iv) Snap-on alignment devices for fan supports. The snap-on buttons, flaps, projections, pins or rails, etc. on the fan's horizontal sides (part of the plastic fan frames, for example) are operative to align the fans as a flat surface. They are also operative to arrange the two (or more) rows of fans into a single flat vertical surface for pressing against the sealing on the rear wall plate.

(v) Cantilever insertion force applicator operative to push against the upper section of the fans (e.g., above the median plane or axis of the top FTA housing portion), thus changing insertion force direction as the fans are changing direction in the slide channels. One skilled in the art will appreciate that the positioning of the applicator 253 in the example embodiments herein is preferably offset from the median plane 202 of the top FTA housing portion so as to facilitate the changing or conversion of a horizontally applied forced to a vertical force around the chassis corners, thereby overcoming the rotational resistance of the fan assembly in a smooth manner.

Additional variations, arrangements, implementations, and associated advantages within the scope of the present disclosure may be set forth as follows. In one embodiment, the upper slide or top tracking channel (e.g., tracking channel 131A) dimensionally optimized to match a guiding pin on the upper fan, whereas the lower slide or bottom tracking channel (e.g., tracking channel 131B) dimensionally optimized to match a guiding pin on the lower fan. This solution allows the fan rows to follow individual, optimized paths during insertion and retraction, thus minimizing the depth and pitch required to fit the fan tray solution. For multi-row fan assemblies, another embodiment may involve similarly providing corresponding tracking paths on the slide guide plates, although such an implementation may require additional tooling and precision engineering. Yet another embodiment may involve using a single rail or tracking channel, which may require larger installation depth and may result in the fans being canted after installation. The guiding pins are dimensionally matched to fit in holes on the individual fan units. The holes can be symmetrically placed in order to facilitate mass production of common fan units that may be individualized later on depending on the application. The smooth S-shape of the dual tracking paths is advantageous for allowing the fans to negotiate the corner, turn fully vertical and then push against the air seals at the rear of the chassis. In a further embodiment, the tracking channels may be provided with wider dimensions in the middle portions of the channels until their distal termini. In such a design the slide channels would be wider throughout their length except at the very end where the fans reach their final installed position. Where gaps open up between the fans when they are in an intermediate position (e.g., the inter-FTA housing portion gapping), such gaps may be filled with various flexible materials to ensure that no foreign parts can slide into the gap and prevent it from being closed. If that were to happen, the whole fan unit may be stuck in an intermediate position, since the gap is closed both when the fans are extracted and when the fans are fully installed. In another embodiment, locks, flaps, rails or similar structural members may be provided as part of the fan housing frames that would align the fans into a single, flat surface. A good air seal without air gaps may be ensured in this manner. An embodiment of the disclosed cantilever insertion force applicator coupled to the rear-mountable FTA unit advantageously solves the problem of the operator applying a straight horizontal force, yet requiring the fans to move in both horizontal and vertical directions as well as turning or twisting (around the corner). The cantilever pusher is configured to work along with the rail geometry to ensure the force is applied in the optimum way to minimize insertion force and friction/bending forces on the guiding pins.

Although various embodiments have been shown and described in detail, the claims are not limited to any particular embodiment or example. None of the above Detailed Description should be read as implying that any particular component, module, element, step, act, or function is essential such that it must be included in the scope of the claims. Reference to an element in the singular is not intended to mean "one and only one" unless explicitly so stated, but rather "one or more" or "at least one". All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. An equipment chassis, comprising:
  a rear-mountable fan tray assembly (FTA) having a plurality of fans configured into two or more horizontal rows, each row comprising one or more fans disposed in an FTA housing portion, wherein each FTA housing portion is coupled to an adjacent FTA housing portion in an articulated manner, a top FTA housing portion being provided with a pair of top guiding pins on respective vertical walls of the top FTA housing portion and a bottom FTA housing portion being provided with a pair of bottom guiding pins on respective vertical walls of the bottom FTA housing portion;
  a cantilevered pusher member having a frontend and a backend, wherein one or more handles are provided at the frontend and an insertion force applicator is provided at the backend that is coupled to the top FTA housing portion in an articulated manner; and
  a first slide guide plate vertically disposed relative to a first interior sidewall frame of the equipment chassis and coupled at a first vertical joint of a rear wall of the equipment chassis, the rear wall having an aperture operating as a vent for the plurality of fans, a second slide guide plate vertically disposed relative to a second interior sidewall frame of the equipment chassis and coupled at a second vertical joint of the rear wall of the equipment chassis, the first and second interior sidewall frames being substantially parallel to each other and forming at least a compartment of the equipment chassis, wherein the first and second slide guide plates are disposed facing each other and each slide guide plate is provided with dual slide tracking paths comprising a top curvilinear tracking path and a bottom curvilinear tracking path, the top curvilinear tracking paths of the first and second slide guide plates operating to engage the respective top guiding pins of the top FTA housing portion and the bottom curvilinear tracking paths of the first and second slide guide plates operating to engage the respective bottom guiding pins of the bottom FTA housing portion when the rear-mountable fan tray assembly is slidably inserted into the equipment chassis and pushed, using the cantilevered pusher member, from front to back of the equipment chassis by applying substantially horizontal force toward the rear wall, whereby the articulated FTA housing portions negotiate a curvilinear motion path from a horizontal orientation to a vertical orientation with minimal friction and, upon full insertion, are disposed vertically with insubstantial angular deviation relative to the rear wall of the equipment chassis.

2. The equipment chassis as recited in claim 1, wherein each FTA housing portion is articulatedly coupled to the adjacent FTA housing portion using a hinge mechanism comprising one or more of barrel hinges, pivot hinges, case hinges, continuous or partial plano hinges, butterfly hinges, flag hinges, strap hinges, counterflap hinges, flush hinges, coach hinges, butt hinges, spring hinges and tee hinges.

3. The equipment chassis as recited in claim 1, wherein a gap formed between an FTA housing portion and a next FTA housing portion adjacent thereto to which it is articulatedly coupled is filled with a flexible filling material.

4. The equipment chassis as recited in claim 3, wherein the flexible filling material comprises a soft expandable foam material.

5. The equipment chassis as recited in claim 1, wherein a gap formed between an FTA housing portion and a next FTA housing portion adjacent thereto to which it is articulatedly coupled is filled with one of a flexible rubber flap and flexible bellows.

6. The equipment chassis as recited in claim 1, wherein the backend of the cantilevered pusher member is articulatedly coupled to the top FTA housing portion using a hinge mechanism selected from one or more of barrel hinges, pivot hinges, case hinges, continuous or partial plano hinges, butterfly hinges, flag hinges, strap hinges, counterflap hinges, flush hinges, coach hinges, butt hinges, spring hinges and tee hinges.

7. The equipment chassis as recited in claim 1, wherein the top guiding pins are provided as replaceable pins inserted in corresponding holes formed in the respective vertical walls of the top FTA housing portion.

8. The equipment chassis as recited in claim 1, wherein the bottom guiding pins are provided as replaceable pins inserted in corresponding holes formed in the respective vertical walls of the bottom FTA housing portion.

9. The equipment chassis as recited in claim 1, wherein the top guiding pins and the bottom guiding pins are offset relative to each other from a median plane of the rear-mountable fan tray assembly.

10. The equipment chassis as recited in claim 9, wherein the offset between the top guiding pins and the bottom guiding pins corresponds to a distance between proximal termini of the top curvilinear tracking paths and the bottom curvilinear paths provided with each slide guide plate.

11. The equipment chassis as recited in claim 10, wherein the top curvilinear tracking path and the bottom curvilinear path provided with each slide guide plate start at the respective proximal termini and follow a substantially smooth S-shape until respective distal termini.

12. The equipment chassis as recited in claim 1, wherein each FTA housing portion is provided with a snap-on alignment locking device operative to removably snap onto a corresponding to a snap-on alignment locking device provided with an adjacent FTA housing portion when the rear-mountable fan tray assembly is fully inserted into the equipment chassis.

* * * * *